United States Patent
Hasegawa

(10) Patent No.: US 6,822,322 B1
(45) Date of Patent: Nov. 23, 2004

(54) SUBSTRATE FOR MOUNTING A SEMICONDUCTOR CHIP AND METHOD FOR MANUFACTURING A SEMICONDUCTOR DEVICE

(75) Inventor: Hidenori Hasegawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/625,615

(22) Filed: Jul. 24, 2003

Related U.S. Application Data

(62) Division of application No. 09/788,664, filed on Feb. 21, 2001, now Pat. No. 6,630,368.

(30) Foreign Application Priority Data

Feb. 23, 2000 (JP) ......................................... 2000/046529

(51) Int. Cl.[7] .......................... H01L 23/48; H01L 23/52; H01L 29/40
(52) U.S. Cl. ....................... 257/692; 257/690; 257/691; 257/776; 257/782; 257/786
(58) Field of Search ................................ 257/686, 737, 257/777, 690, 691, 692, 776, 782, 784, 786

(56) References Cited

U.S. PATENT DOCUMENTS

| 6,022,757 A | 2/2000 | Andoh |
| 6,700,186 B2 * | 3/2004 | Yasunaga et al. ............ 257/672 |
| 6,700,192 B2 * | 3/2004 | Matsuzawa et al. ......... 257/692 |
| 2001/0045630 A1 * | 11/2001 | Ikenaga et al. .............. 257/676 |
| 2003/0098503 A1 * | 5/2003 | Ikenaga et al. .............. 257/723 |

FOREIGN PATENT DOCUMENTS

| JP | 09-55398 | 2/1997 |
| JP | 2000-12989 | 1/2000 |

* cited by examiner

*Primary Examiner*—Nathan J. Flynn
*Assistant Examiner*—Victor A. Mandala, Jr.
(74) *Attorney, Agent, or Firm*—Volentine Francos & Whitt, PLLC

(57) ABSTRACT

A mounting substrate includes a substrate body having at least first and second adjacent chip mounting regions on a surface thereof, and a dicing line between the first and second mounting regions; a first plurality of inner electrodes aligned along a first side of the first chip mounting region; a second plurality of inner electrodes aligned along a second side of the second chip mounting region, wherein the first side of the first chip mounting region confronts the second side of the second chip mounting region; and an interconnect wiring pattern located between the first and second chip mounting regions, and commonly connected to the first plurality of inner electrodes and the second plurality of inner electrodes, wherein the interconnect wiring pattern includes a plurality of connecting wiring portions and at least some of the wiring pattern extends obliquely across the dicing line.

3 Claims, 6 Drawing Sheets

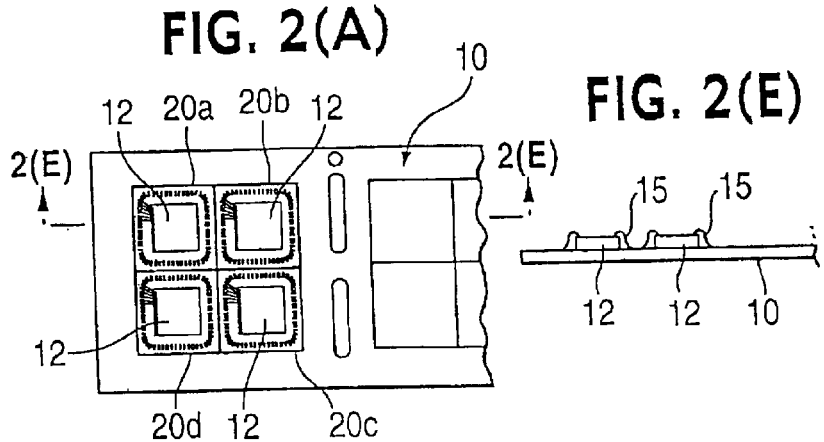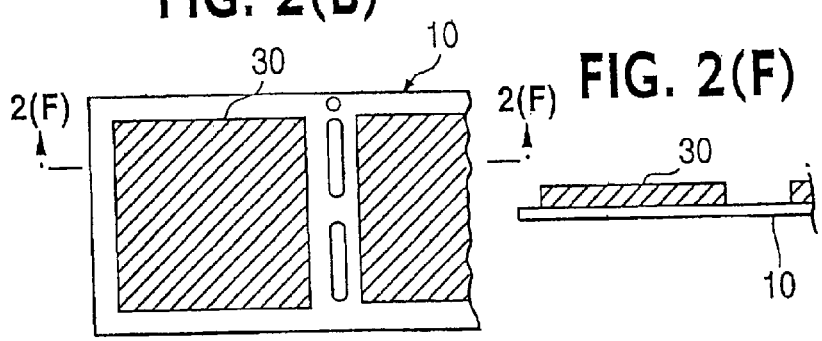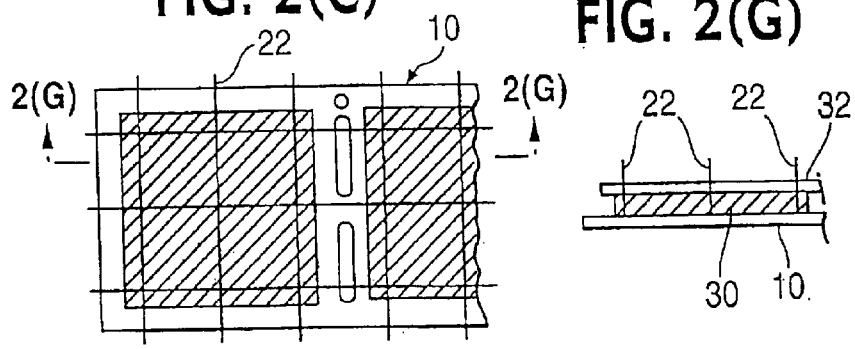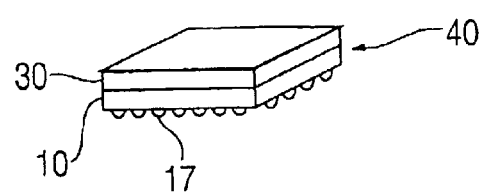

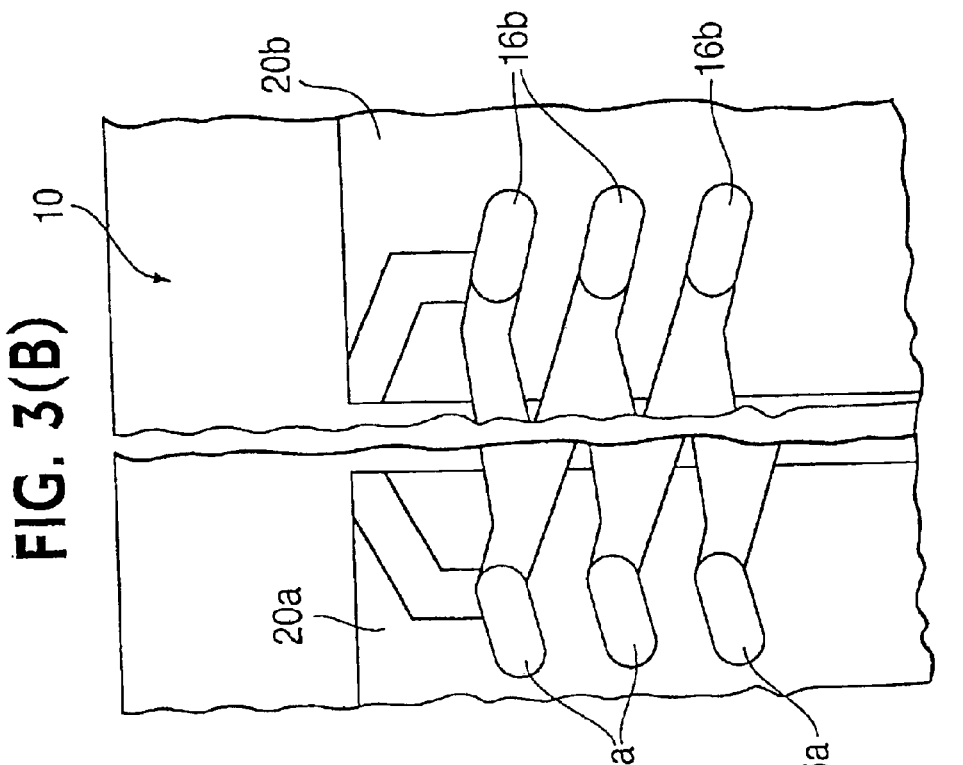
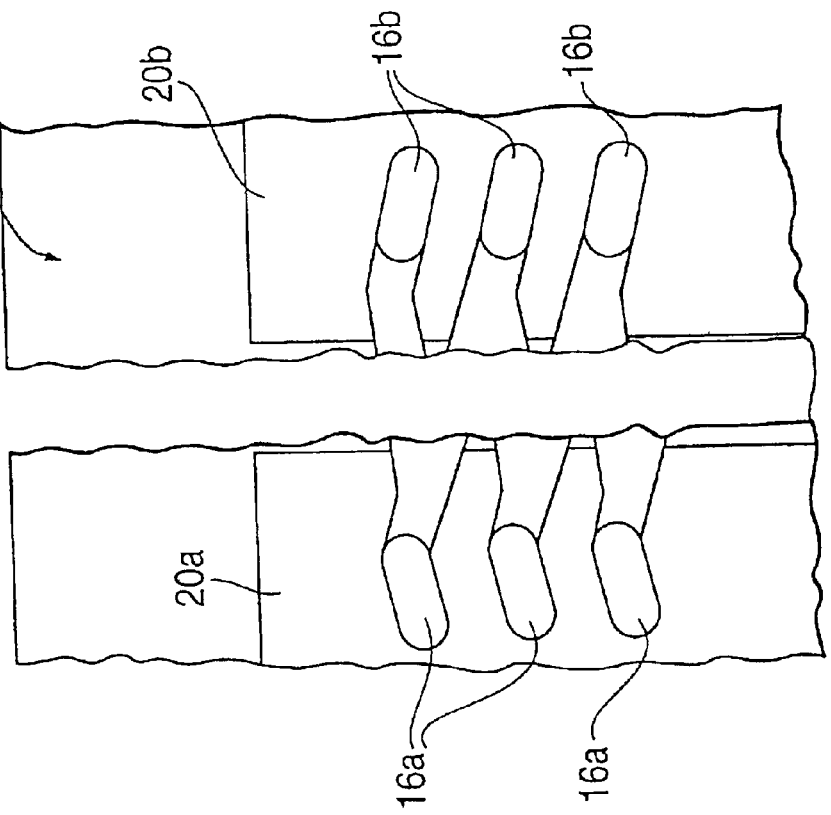

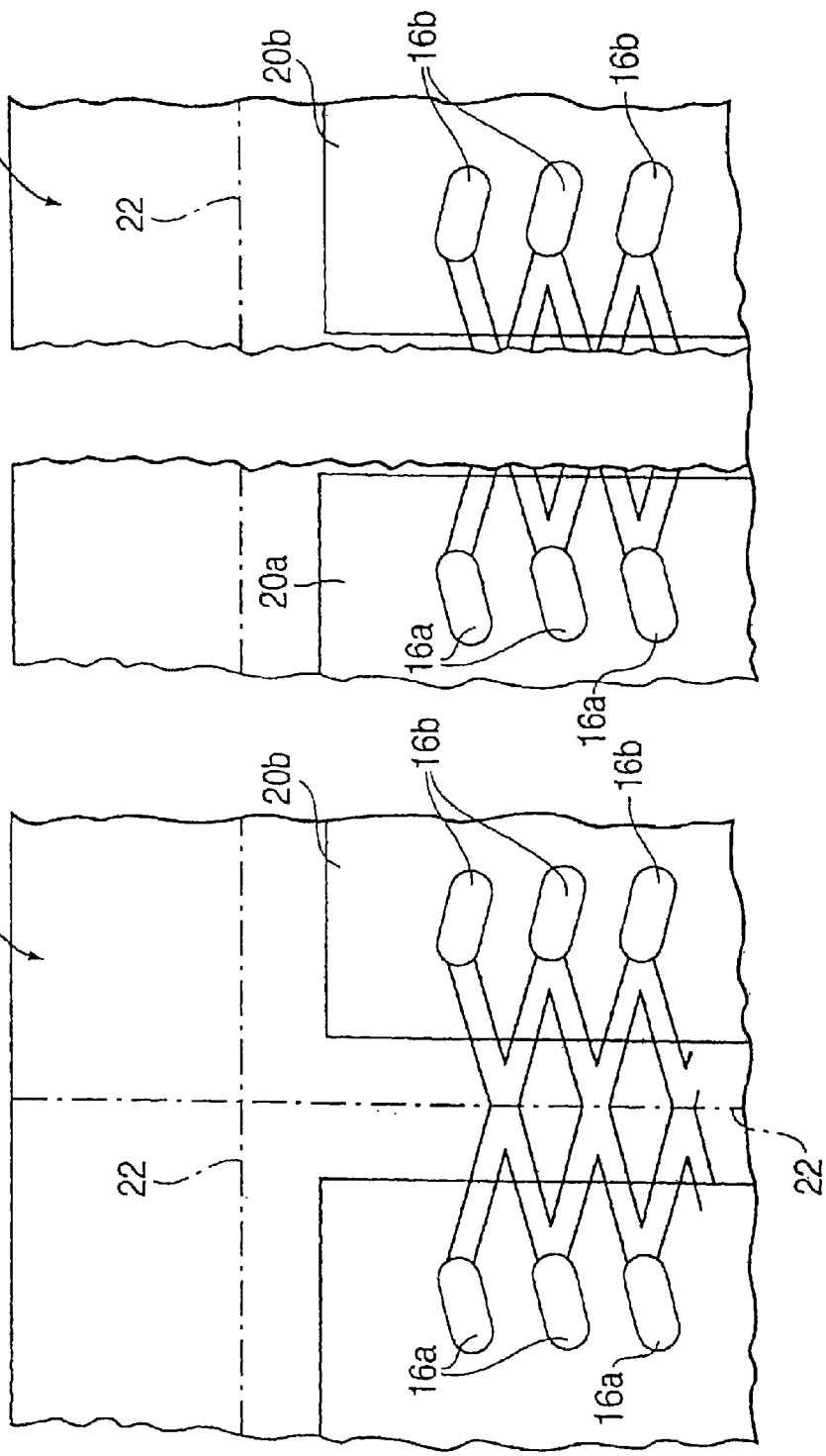

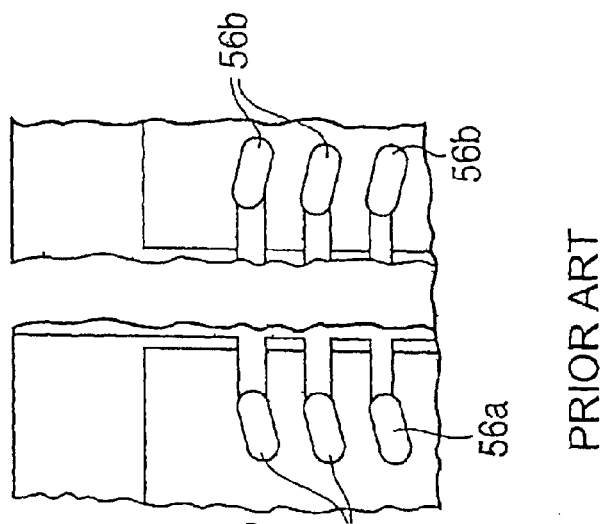
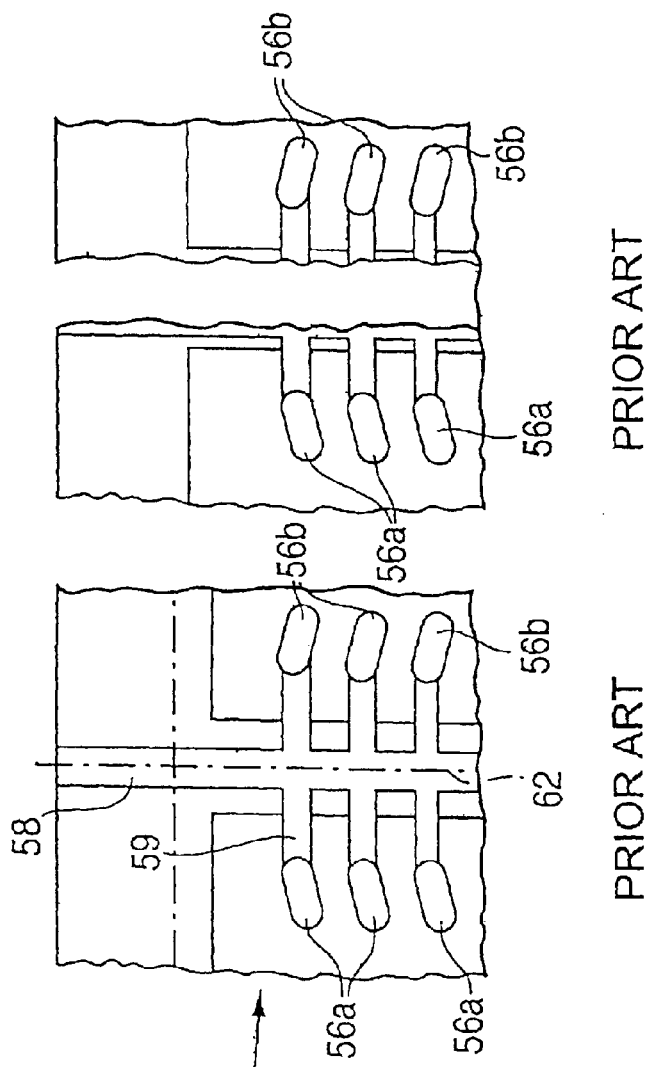
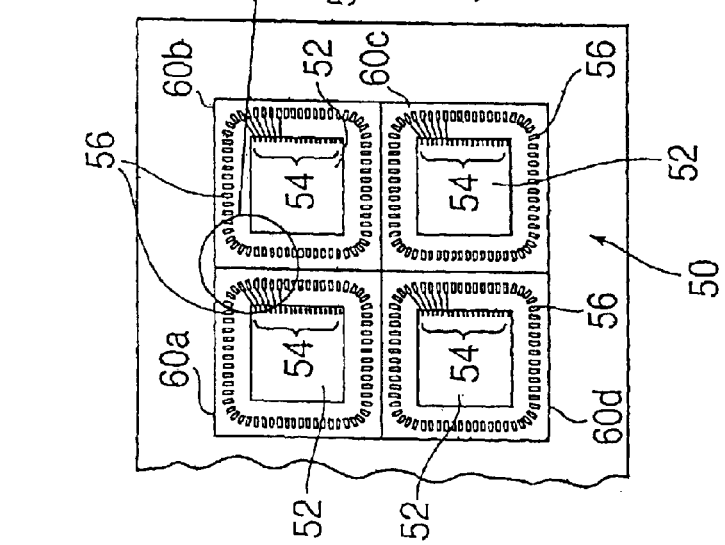

SUBSTRATE FOR MOUNTING A SEMICONDUCTOR CHIP AND METHOD FOR MANUFACTURING A SEMICONDUCTOR DEVICE

CROSS REFERENCE TO RELATED APPLICATIONS

This is a divisional application of application Ser. No. 09/788,664, filed Feb. 21, 2001, now U.S. Pat. No. 6,630,368 which is hereby incorporated by reference in its entirety for all purposes.

BACKGROUND OF THE INVENTION

1. Field of the Invention

This invention relates to a substrate for mounting of a semiconductor chip, and to a method for manufacturing a semiconductor device.

2. Description of the Related Art

A substrate for mounting of a semiconductor chip (mounting substrate) generally has a plurality of mounting regions as shown in FIG. 6(A). A semiconductor device is conventionally mounted as described below.

Semiconductor chips 52 are mounted on mounting regions 60a–60d of a mounting substrate 50, respectively. Pads 54 of each semiconductor chip are connected by bonding wires to inner electrodes 56 of a corresponding mounting region. The mounting regions 60a–60d are then filled with resin, and the mounting substrate 50 is diced into individual semiconductor devices.

As seen in FIG. 6(B), inner electrodes 56a and 56b are formed on the mounting substrate 50, and each inner electrode 56a, 56b is connected to an outer electrode via through holes (not shown). These inner electrodes 56 are generally formed by electroplating. All of the inner electrodes 56 are electrically and physically connected to each other by interconnections 58 and 59 before the mounting substrate 50 is diced along dicing line 62 into individual semiconductor devices. However, after dicing, the inner electrodes 56 should be electrically isolated from one another.

The interconnect wiring pattern 58 corresponds to the dicing line, and the interconnect wiring pattern 58 is supposed to be removed by a dicing blade during dicing the mounting substrate. However, if the position of the dicing blade is shifted, a portion of the interconnect wiring pattern 58 remains as shown in FIG. 6(C). In some cases, the remaining portion of the interconnect wiring pattern 58 connects one inner electrode to another inner electrode, thus short-circuiting the inner electrodes.

SUMMARY OF THE INVENTION

An object of the present invention is to solve the above-described problem.

According to one aspect of this invention, for achieving the above object, A mounting substrate includes a substrate body having at least first and second adjacent chip mounting regions defined on a surface thereof, and further having a dicing line defined between the first and second mounting regions; a first plurality of inner electrodes aligned along a first side of the first chip mounting region, a second plurality of inner electrodes aligned along a second side of the second chip mounting region, wherein the first side of the first chip mounting region confronts the second side of the second chip mounting region, an interconnect wiring pattern located between the first and second chip mounting region, and commonly connected to the first plurality of inner electrodes and the second plurality of inner electrodes, wherein the interconnect wiring pattern includes a plurality of connected wiring portions, and wherein at least some of said wiring pattern extend obliquely across the dicing line.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings, in which:

FIGS. 2(A)–2(G) are process diagrams illustrating process steps employed in a method using a mounting substrate of the present invention;

FIGS. 3(A)–(B) are enlarged diagrams showing a boundary portion between mounting regions after dicing;

FIGS. 5(A)–(B) are enlarged diagrams showing a boundary portion between mounting regions according to another example of the present invention; and FIGS. 6(A)–(C) are schematic diagrams of the prior art.

DESCRIPTION OF THE PREFERRED EMBODIMENTS

Preferred embodiments of the present invention will hereinafter be described in detail with reference to the accompanying drawings.

Figure 1B:
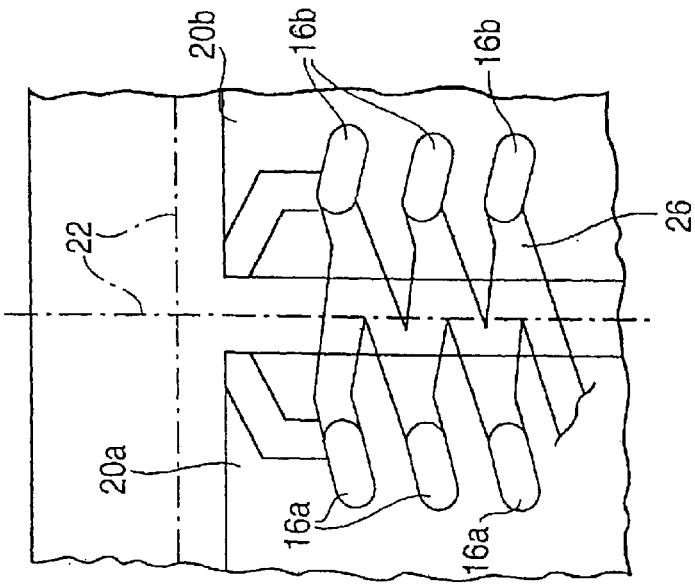
FIG. 1(B) is an enlarged view of a boundary portion between mounting regions.
Figure 1A:
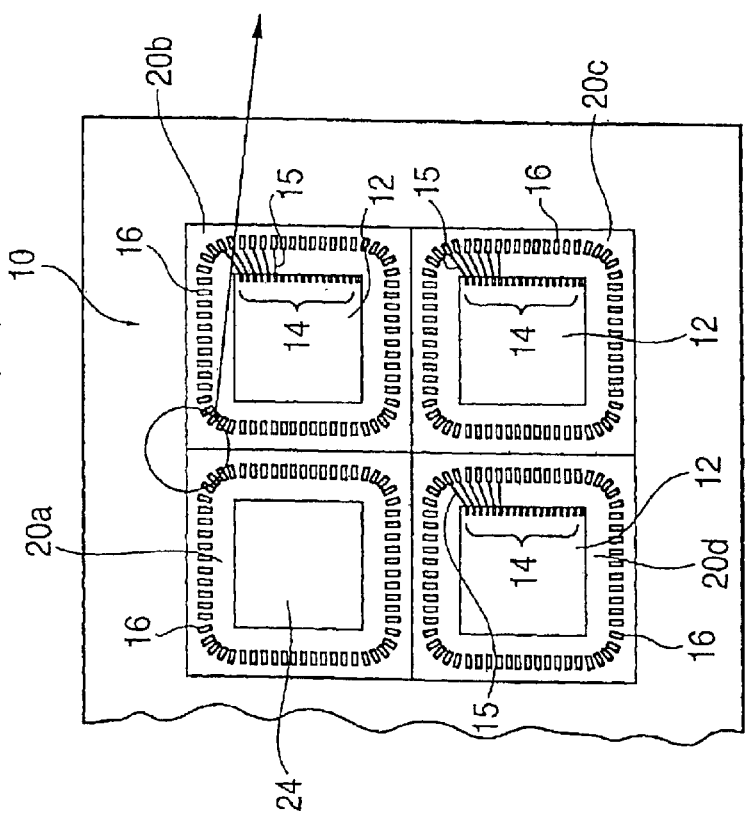
FIG. 1(A) is a top view diagram showing a substrate for mounting a semiconductor chip according to a first embodiment of the present invention.

A mounting substrate 10 of this embodiment has a plurality of mounting blocks as shown in FIG. 1(A), with each mounting block having four mounting regions 20a–20d. Each mounting region has a plurality of inner electrodes 16 on its peripheral portion, and a die pad 24 on its central portion where a semiconductor chip 12 is fixed thereon.

A semiconductor chip 12 is mounted on each mounting region. Pads 14 of each semiconductor chip are connected to inner electrodes 16 of a corresponding mounting region by wires. Each inner electrode 16 is connected to outer electrodes via through holes. Pads 14 on one semiconductor chip are electrically connected to outer electrodes via through holes and inner electrodes 16.

Interconnect wiring pattern 26 are formed on the boundary portion between mounting regions in this embodiment. (For example, between regions 20a and 20b, regions 20b and 20c, regions 20c and 20d, and regions 20d and 20a). The interconnect wiring pattern 26 connect inner electrodes 16 of one mounting region to the inner electrodes of another mounting region prior to dicing. As shown in FIG. 1(B), the interconnect wiring pattern configured in a zig-zag pattern according to the present embodiment.

In particular, the mounting substrate 10 has first plurality of inner electrodes 16a arranged in line near the edge of first mounting region 20a. It also has second plurality of inner electrodes 16b arranged in line near the edge of second mounting region 20b. The edge of the second mounting region 20b is adjacent to the edge of the first mounting region 20a.

A dicing line 22 is defined between the first plurality of inner electrodes and the second plurality of inner electrodes. The interconnect wiring pattern 26 is located between the first and second chip mounting region, and commonly connected to the first plurality of inner electrodes and the second plurality of inner electrodes. The interconnect wiring pattern 26 of this embodiment do not have a portion which extends coincident with the dicing line 22. Each interconnect wiring pattern 26 is formed by electroplating to electrically connect the inner electrodes 16 using electroplating. However, they should not have an extending portion in the same direction of dicing line 22, especially near the boundary between the mounting regions 20.

The interconnect wiring pattern 26 of this embodiment includes a plurality of connected wiring portions in which at least some of the wiring pattern extend obliquely across the dicing line 22.

FIG. 2 shows a schematic diagram for describing a method for manufacturing a semiconductor device using this mounting substrate.

Semiconductor chips 12 are fixed on mounting regions 20a–20d of a mounting substrate 10, respectively. Pads 14 of each semiconductor chip are connected to the inner electrodes 16 of a corresponding mounting region using bonding wire 15. (FIGS. 2(A) and 2(E)).

Then, each mounting block is filled with resin 30 as shown in FIGS. 2(B) and 2(F). A dicing tape 32 is adhered on the surface of the molded resin 30. The mounting substrate 10 is diced into individual semiconductor devices 40. FIGS. 2(C) and 2(G) Solder bumps 17 are then formed on outer electrodes of the mounting substrate. (FIG. 2(D)

FIG. 3(A) and FIG. 3(B) shows a schematic diagram of the mounting substrate after dicing.

Figure 4B:
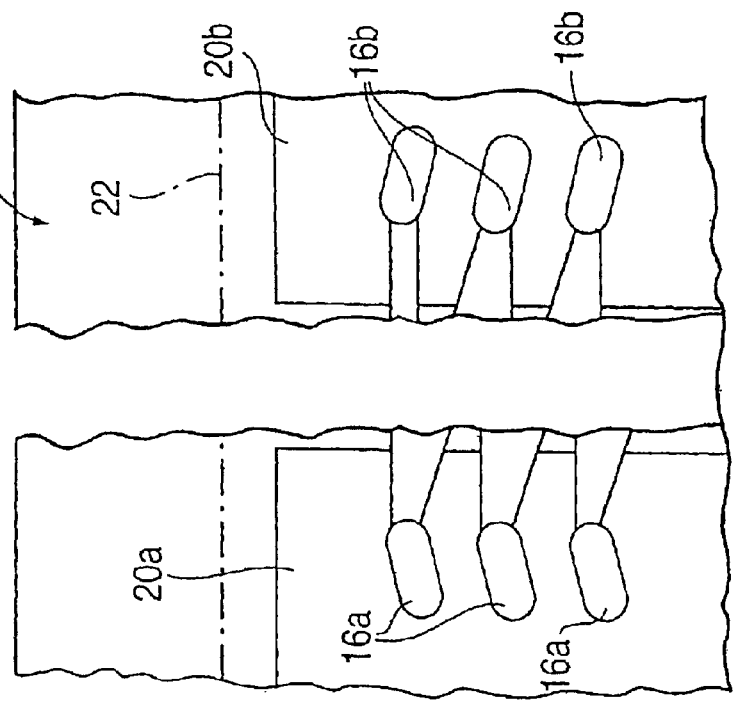
FIGS. 4(A)–(B) are enlarged diagrams showing a boundary portion between mounting regions according to another example of the present invention.
Figure 4A:
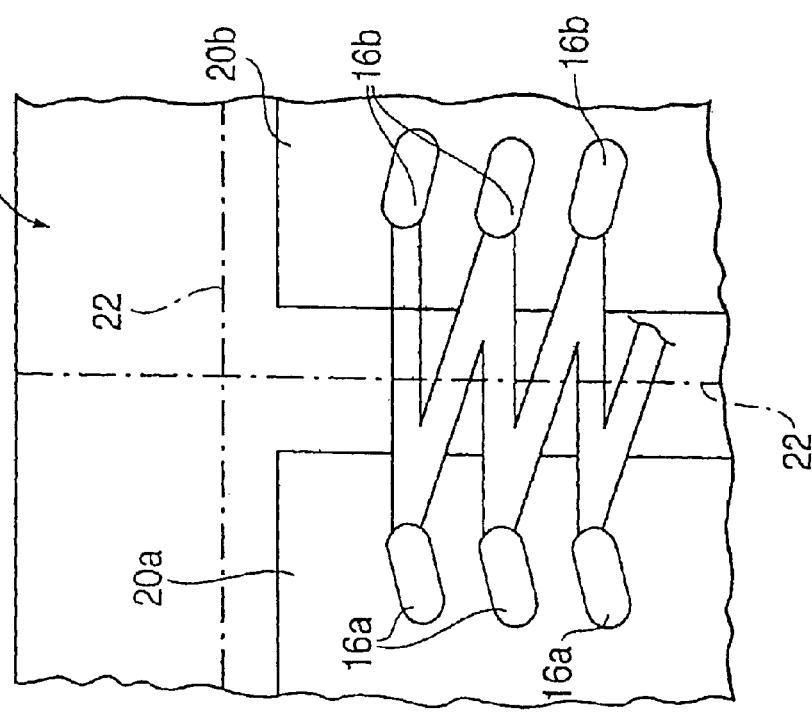

As shown in FIGS. 3(A) and 3(B), each inner electrode 16 is electrically isolated because the interconnect wiring pattern 26 do not have an extending portion corresponding to the dicing line 22. A narrow dicing blade can be used because the interconnect wiring pattern 26 are formed in a zigzag pattern. Therefore, the width of a boundary portion can be decreased. The number of semiconductor devices formed in one mounting substrate thus can be increased FIG. 4(A), which contains the same reference numbers to denote like elements as FIG. 1, shows another example of achieving the effects of this invention. FIG. 4(B) shows a schematic diagram of the mounting substrate of FIG. 4(A) after dicing. The interconnect wiring pattern 26 of this embodiment includes a plurality of connected wiring portions in which at least some of the wiring pattern extend obliquely across the dicing line 22. Other wiring patterns of the interconnect wiring pattern extend at right angle across the dicing line 22. This pattern does not have an interconnect portion which extends in the same direction as the dicing line 22. As can be seen from FIG. 4(B), the inner electrodes 16 are electrically isolated one another after dicing.

FIG. 5(A), which contains the same reference numbers to denote like elements as FIG. 1, shows another example of achieving the effects of this invention. FIG. 5(B) shows a schematic diagram of the mounting substrate of FIG. 5(A) after dicing. The interconnect wiring pattern 26 of this embodiment includes a plurality of connected wiring portions in which at least some of the wiring pattern extend obliquely in one direction across the dicing line 22. Other wiring patterns of the interconnect wiring pattern extend obliquely in another direction across the dicing line 22. This pattern does not have an interconnect portion which extends in the same direction as the dicing line 22.As can be seen from FIG. 5B), the inner electrodes 16 are electrically isolated one another after dicing.

According to this invention, short-circuiting of the inner electrodes after dicing is avoided The manufacturing efficiency is thus improved.

What is claimed is:

1. A mounting substrate, comprising:

a substrate body having at least first and second adjacent chip mounting regions defined on a surface thereof, and further having a dicing line defined between the first and second mounting regions;

a first plurality of inner electrodes aligned along a first side of the first chip mounting region;

a second plurality of inner electrodes aligned along a second side of the second chip mounting region, wherein the first side of the first chip mounting region confronts the second side of the second chip mounting region; and an interconnect wiring pattern located between the first and second chip mounting region, and commonly connected to the first plurality of inner electrodes and the second plurality of inner electrodes, wherein the interconnect wiring pattern includes a plurality of connected wiring portions, and wherein at least some of said wiring pattern extend obliquely across the dicing line.

2. The mounting substrate according to claim 1, and wherein other wiring patterns of the interconnect wiring pattern extend at right angles across the dicing line.

3. The mounting substrate according to claim 1, wherein the interconnecting wiring pattern has a zigzag configuration.

* * * * *